United States Patent
Hamid

(10) Patent No.: US 7,360,184 B1
(45) Date of Patent: Apr. 15, 2008

(54) METHOD AND APPARATUS FOR SCENARIO SEARCH BASED RANDOM GENERATION OF FUNCTIONAL TEST SUITES

(76) Inventor: Adnan A. Hamid, 8217 Edgemoor Pl., Austin, TX (US) 78749

( * ) Notice: Subject to any disclaimer, the term of this patent is extended or adjusted under 35 U.S.C. 154(b) by 199 days.

(21) Appl. No.: 11/145,646

(22) Filed: Jun. 6, 2005

Related U.S. Application Data

(63) Continuation of application No. 10/411,067, filed on Apr. 9, 2003, now Pat. No. 6,968,285.

(51) Int. Cl.
    *G06F 17/50* (2006.01)
(52) U.S. Cl. .............................. 716/4; 716/5
(58) Field of Classification Search .......... 716/4–6; 702/119
    See application file for complete search history.

(56) References Cited

U.S. PATENT DOCUMENTS

| | | | |
|---|---|---|---|
| 4,716,564 A | 12/1987 | Hung et al. ............... 714/738 |
| 5,202,889 A | 4/1993 | Aharon et al. ............. 371/27 |
| 5,724,504 A | 3/1998 | Aharon et al. ......... 395/183.09 |
| 5,995,914 A * | 11/1999 | Cabot ...................... 702/109 |
| 5,995,915 A * | 11/1999 | Reed et al. ............... 702/119 |
| 6,141,630 A | 10/2000 | McNamara et al. .......... 703/14 |
| 6,182,258 B1 | 1/2001 | Hollander .................. 714/739 |
| 6,195,616 B1 * | 2/2001 | Reed et al. ................ 702/119 |
| 6,219,809 B1 | 4/2001 | Noy ......................... 714/724 |
| 6,266,787 B1 | 7/2001 | McDermid et al. ........... 714/33 |
| 6,295,517 B1 | 9/2001 | Roy et al. .................. 703/15 |
| 6,347,388 B1 | 2/2002 | Hollander .................. 714/739 |
| 6,487,704 B1 | 11/2002 | McNamara et al. ........... 716/5 |
| 6,499,132 B1 | 12/2002 | Morley et al. ............... 716/5 |
| 6,502,232 B1 | 12/2002 | Campenhout ............... 716/18 |
| 6,519,727 B2 | 2/2003 | Noy ......................... 714/724 |
| 6,526,562 B1 | 2/2003 | Haddad et al. .............. 716/18 |
| 6,530,054 B2 | 3/2003 | Hollander et al. .......... 714/739 |
| 6,647,513 B1 | 11/2003 | Hekmatpour ............... 714/37 |
| 6,675,138 B1 | 1/2004 | Hollander et al. ............ 703/13 |
| 6,684,359 B2 | 1/2004 | Noy ......................... 714/741 |
| 6,687,662 B1 | 2/2004 | McNamara et al. .......... 703/14 |
| 6,698,003 B2 | 2/2004 | Baumgartner et al. ......... 716/4 |
| 6,968,285 B1 * | 11/2005 | Hamid ...................... 702/119 |
| 2001/0010091 A1 * | 7/2001 | Noy .......................... 716/4 |
| 2003/0188224 A1 | 10/2003 | Decker ...................... 714/25 |
| 2004/0133409 A1 | 7/2004 | Mukherjee et al. .......... 703/14 |

\* cited by examiner

*Primary Examiner*—Jack Chiang
*Assistant Examiner*—Binh Tat
(74) *Attorney, Agent, or Firm*—Campbell Stephenson LLP; Jonathan N. Geld

(57) ABSTRACT

A method of describing a set of tests capable of being performed on a device under test (DUT) is disclosed. The method includes identifying a scenario space of the DUT.

16 Claims, 4 Drawing Sheets

METHOD AND APPARATUS FOR SCENARIO SEARCH BASED RANDOM GENERATION OF FUNCTIONAL TEST SUITES

CROSS-REFERENCE TO RELATED APPLICATIONS

This application is a continuation of U.S. patent application Ser. No. 10/411,067, entitled "Method And Apparatus For Scenario Search Based Random Generation of Functional Test Suites", filed Apr. 9, 2003 now U.S. Pat. No. 6,968,285, and naming Adnan A. Hamid as the inventor. This application is hereby incorporated by reference, in its entirety and for all purposes.

BACKGROUND OF THE INVENTION

1. Field of the Invention

The present invention relates to the testing of electronic systems, and, more particularly, to a method and apparatus for automatically generating tests for a digital system.

2. Description of the Related Art

Advances in digital electronic technology allows the development of increasingly complex digital electronic systems that include a combination of hardware and software components. These systems must be tested, or functionally verified, to ensure that they operate correctly under as many conditions as possible. It is widely accepted that the complexity of functional verification for a system increases as a square of system complexity. Currently proper verification of a new system is one of the biggest challenges when developing a new product, consuming 50% or more of development resources.

The central problem in functional verification is trying to cover every possible condition, or scenario, that the design may encounter during operation. Functional verification should cover (a) each individual design function, (b) each architectural component of the design, (c) interactions between design functions (and preferably all such interactions) (d) interactions between architectural components (again, preferably all such interactions), and finally (e) interactions between design functions and architectural components (again, preferably all such interactions).

Formal verification techniques attempt to mathematically prove correctness of a design without requiring any tests, but these techniques are generally able to handle designs of limited complexity. What is required is a collection of thorough functional tests that can be run in either simulation or on the fabricated product to find any potential flaws in the design. Furthermore, in order to support development of large, complex designs, these tests should support hierarchical verification: in additional to verifying the whole system, it should be possible to create tests for part or all of any module or collection of modules that make up the system.

Modern digital electronic systems are too complex to analyze the entire system at once when considering the possible cases that require testing. Instead it is necessary to carefully analyze both the functional specification(s) and the design architecture for the system to consider all possible test cases. Both the functional specification and the design architecture should be broken into a set of component modules that are small enough to analyze as a unit. Each module can then be considered independently in order to define the set of tests that could be run on that module. The linkages or interactions between modules can then be analyzed separately.

Such analysis, especially when considering all possible tests for all module, will lead to a very large number of possible test cases. Limitations of time and equipment make it possible to run only a small fraction of these tests. A method is required to efficiently capture the entire space of possible tests, and then select a random distribution of tests to run from that space. It should be possible to combine information about possible tests for multiple modules to create tests that verify both individual modules and the interactions between those modules. A method is needed to control the scope and distribution of the generated tests to ensure sufficient testing of all parts of the system at different levels of hierarchy.

The required format for tests may be very different for different stages of design development and at various levels of verification hierarchy. For example, the style of tests needed when running in simulation may be very different from the style of diagnostic tests required when running on a fabricated system. Elements of test style may include how the test is applied to the design, how expected results are created, and how the set of tests is analyzed to measure how much of the design has been tested.

A number functional verification tools are currently available. However, none of these tools provide the verification engineer with any mechanism to analyze a complex design in terms of its component modules, instead requiring the engineer to think about testing the entire system as a whole. No mechanism is provided for capturing information about a complex set of possible tests, or for selecting a random distribution of tests from within that set.

Some tools provide engineers with a mechanism for generating random stimulus for specific inputs to the system. These solutions may test part of the module which receives that input, but do not consider the possible interactions this module may have with the rest of the system—in other words, only a small subset of the possible tests are covered. Other tools provide tests for a specific design component (e.g., a microprocessor), but do not lend themselves to be extensible by the verification engineer to test the rest of the system—again, only a portion of the possible set of tests are being covered.

It is difficult to use these tools to generate tests for use at different levels of verification hierarchy, because (a) the tools lack the flexibility to properly cover all (or even substantially all) possible tests at each level of the hierarchy, and (b) the tools do not support the different test formats that may be required at various levels of verification hierarchy.

What is therefore needed is an apparatus and method for functional verification that overcomes the problems of prior art.

SUMMARY OF THE INVENTION

In one embodiment, a method of describing a set of tests capable of being performed on a device under test (DUT) is disclosed. The method includes identifying a scenario space of the DUT.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

The following is intended to provide a detailed description of an example of the invention and should not be taken to be limiting of the invention itself. Rather, any number of variations may fall within the scope of the invention which is defined in the claims following the description.

Introduction

Figure 1:
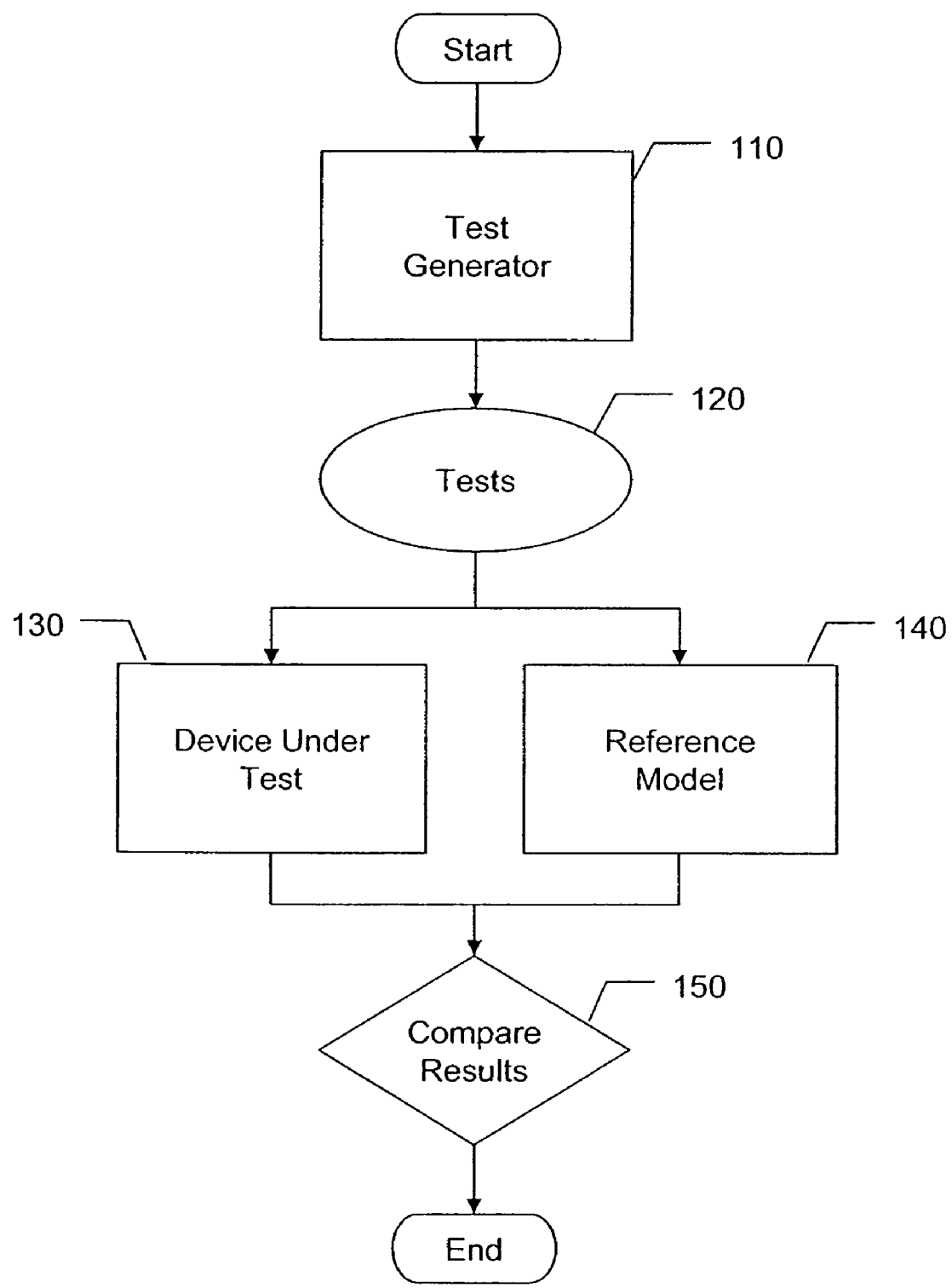
FIG. 1 is a flow diagram depicting the steps typically involved in testing a design.

Microchips are the "brains" that drive electronic devices like computers, PDA's and cell phones. When engineers are developing microchips, the designs thus created need to be tested to ensure that the resulting product will operate as desired. FIG. 1 shows the typical method for doing this testing. A test generator (depicted in FIG. 1 as a test generator 110) is used to generate a number of tests (depicted in FIG. 1 as tests 120) are created to both the design being developed (otherwise known as the device under test (DUT) (depicted in FIG. 1 as a DUT 130)) as well as a reference model (depicted in FIG. 1 as a reference model 140) that defines the correct (or at least, expected) behavior of DUT 130. The results from the device under test are compared with those of the reference model to see if the design operated correctly (and depicted in FIG. 1 as a result comparison 150).

As electronic products become more complicated and incorporate more functions (e.g., cell phones which not only receive calls but also play games), the development of tests becomes more challenging. More tests are needed (e.g., to check that the cell phone properly receives calls and properly plays games), and these tests need to be more sophisticated (e.g., to check that the cell phone can receive calls while playing a game). Modern chips are so complicated that creating tests can consume over half of the engineers' time when developing a new microchip.

Embodiments of the present invention provide an easy way for engineers designing a microchip to provide a complete description of the microchip's testable features to a computer program. The computer program (test generator 110) can then automatically create (i.e., generate) as many tests as the engineers need.

This technology provides several advantages over current methods. First, instead of spending many man years creating tests for a new microchip, engineers can quickly describe what needs to be tested and let the computer program automatically create the required tests. Second, engineers often develop design modules which go into multiple microchips. Once an engineer describes what can be tested on a module, the same description can be reused on every chip that uses the module. Finally, as microchip development progresses, tests are required in a number of different formats. This invention can use the same descriptions to create tests in various different formats.

Overview

The present invention is a method and apparatus for the automated generation of functional tests based on a scenario search algorithm. There are four steps involved in generating these tests.

First, a process is defined for identifying a set of tests, referred to herein as a scenario space, for the given system. A scenario space is defined by its corresponding set of tests, with each test being represented as point (or element) in the scenario space. Preferably, substantially all, or even all, possible tests are defined by the scenario space. Initially, the functional specification(s) and the design architecture for the system in broken out into their constituent modules. Each module is considered independently to define the set of (preferably all) possible tests, or scenario space, for that module. A notation, or scenario algebra, is provided to aid in reasoning about scenario spaces, and a method defined to ensure that a sufficient number of (and preferably all) possible tests for each module have been considered. The linkages or interactions between scenario spaces for each module are then analyzed.

Second, the scenario space for each module is encoded in terms of scenario rules. The ability to specialize rules, and frequent reuse of rules when encoding multiple scenario spaces allow scenario rules to provide a compact representation of the complete scenario space for very complex systems.

Third, a software implementation of the scenario search algorithm is run on the defined scenario rules to generate a random distribution of tests within the specified scenario space. This algorithm can combine information about scenario spaces for multiple modules to generate tests that not only verify each module, but also verify the interaction between those modules. The algorithm may be easily controlled to modify the scope and distribution of the generated tests. An internal representation is used to store the test information created at this stage.

Fourth, test formatting rules are used to convert tests from the internal representation into a form suitable for use in the target test environment. Test formatting rules may include information about how to apply test stimulus to the design, how to obtain expected results for the tests, and how to measure how much of the design is being verified by the generated tests.

The apparatus and method for automated generation of tests using the scenario search algorithm provides several advantages over the prior art:

(a) A process is introduced to break a complex design into its component modules and analyzing the set of possible tests for each module separately.

(b) A scenario algebra is introduced to aid in analyzing a set of tests (e.g., the set of all possible tests), or scenario space, that can be used to test each module.

(c) A structured method is defined for ensuring that a set of tests (e.g., the set of all possible tests) is considered when constructing the scenario space for an individual module.

(d) A structured method is defined for ensuring that a set of interactions (e.g., all possible interactions) between modules are considered when defining scenario spaces for a system.

(e) Large and complex scenario spaces for individual modules can be compactly encoded using scenario rules, along with information about linkages or interactions between scenario spaces.

(f) A random distribution of tests can be automatically generated to cover all or part of the scenario space encoded by a set of scenario rules.

(g) Scenario rules for multiple modules can be combined to create tests that verify not only the modules, but the interactions between those modules.

(h) The scope and distribution of generated tests can be easily controlled, and (i) The format of the generated tests can be easily controlled and modified for different applications.

Figure 2:
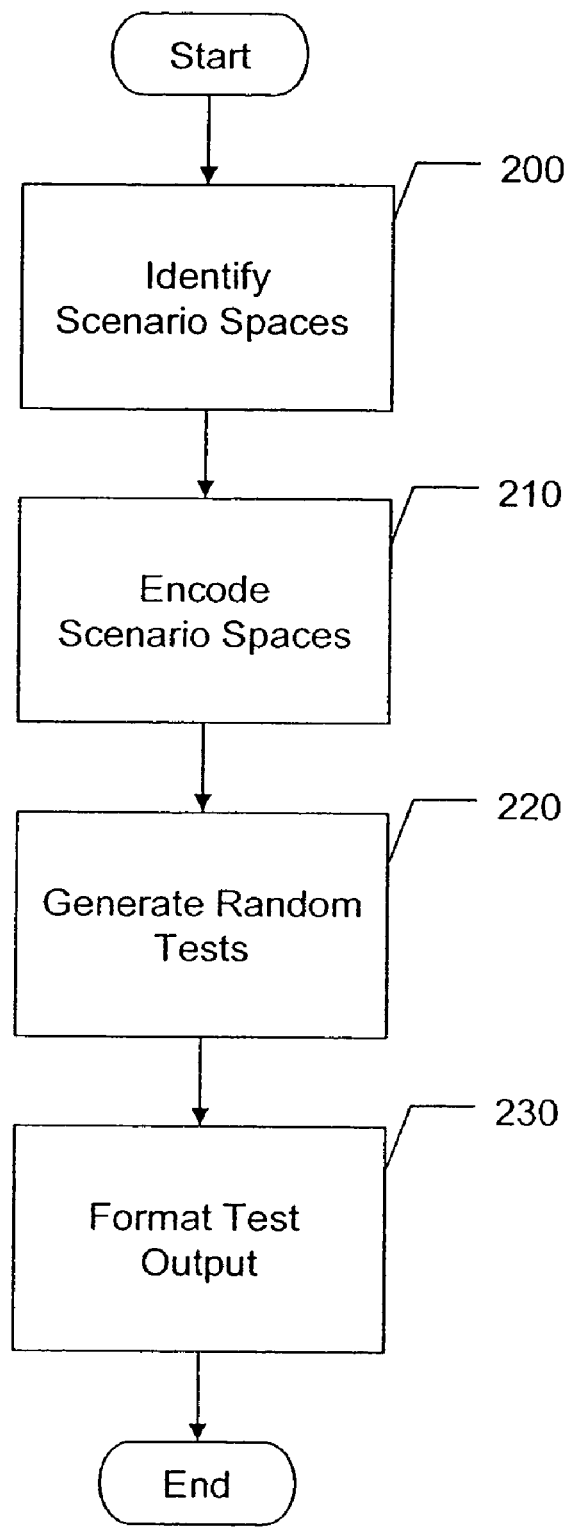
FIG. 2 is a flow diagram depicting the four primary steps involved in generating tests according to an embodiment of the present invention.

FIG. 2 is a flow diagram depicting the four primary steps involved in generating tests using this approach. First, scenario spaces are identified (step 200), which involves analyzing the functional specifications and implementation architecture of the system to be tested in order to define the set of tests that can be run on the system. Next, scenario spaces are encoded (step 210), which involves encoding the scenario spaces defined in step 200 into a computer readable format. Random tests are then generated (step 220), which involves running the scenario search algorithm using the previously-encoded scenario space (from step 210) as input in order to generate a random distribution of tests that cover the scenario space. Finally, the test output is formatted (step 230), in which the previously-generated test(s) (from step 220) is (are) converted to an output format suitable for use in the target verification environment.

In the remainder of this description, an example system to be used to aid explanation is first defined. An example of a nomenclature that can be used for scenario algebra is then defined. This definition is followed by a detailed description of the each of the steps in FIG. 2.

Example System

A simple example system can be defined as an aid in explaining the activities involved in each stage of the flow. The example system is a simple calculator that has the following functional specification:

(a) only positive numbers from 0 to 999 may be provided for numerical input;

(b) the only mathematical operations supported are addition, subtraction and multiplication (these operations are represented by the symbols "+", "−", and respectively);

(c) results from mathematical operations will be in the range −999 to +999 (mathematical results that are outside this range will have their high digits truncated to fit within this range (e.g., 900+350 results in 1250, which will be truncated to 250));

(d) the calculator supports six memory registers, numbered 1 through 6 (the STO operation will store a value to a register (e.g., 400 STO 4 will store the value "400" in register "4"), while the RCL operation will retrieve a register value (e.g., RCL 6 will retrieve the last value stored in register 6)); and (e) operations may be sequenced and nested (e.g., "(1+2)*3" will generate a results of "9").

Figure 3:
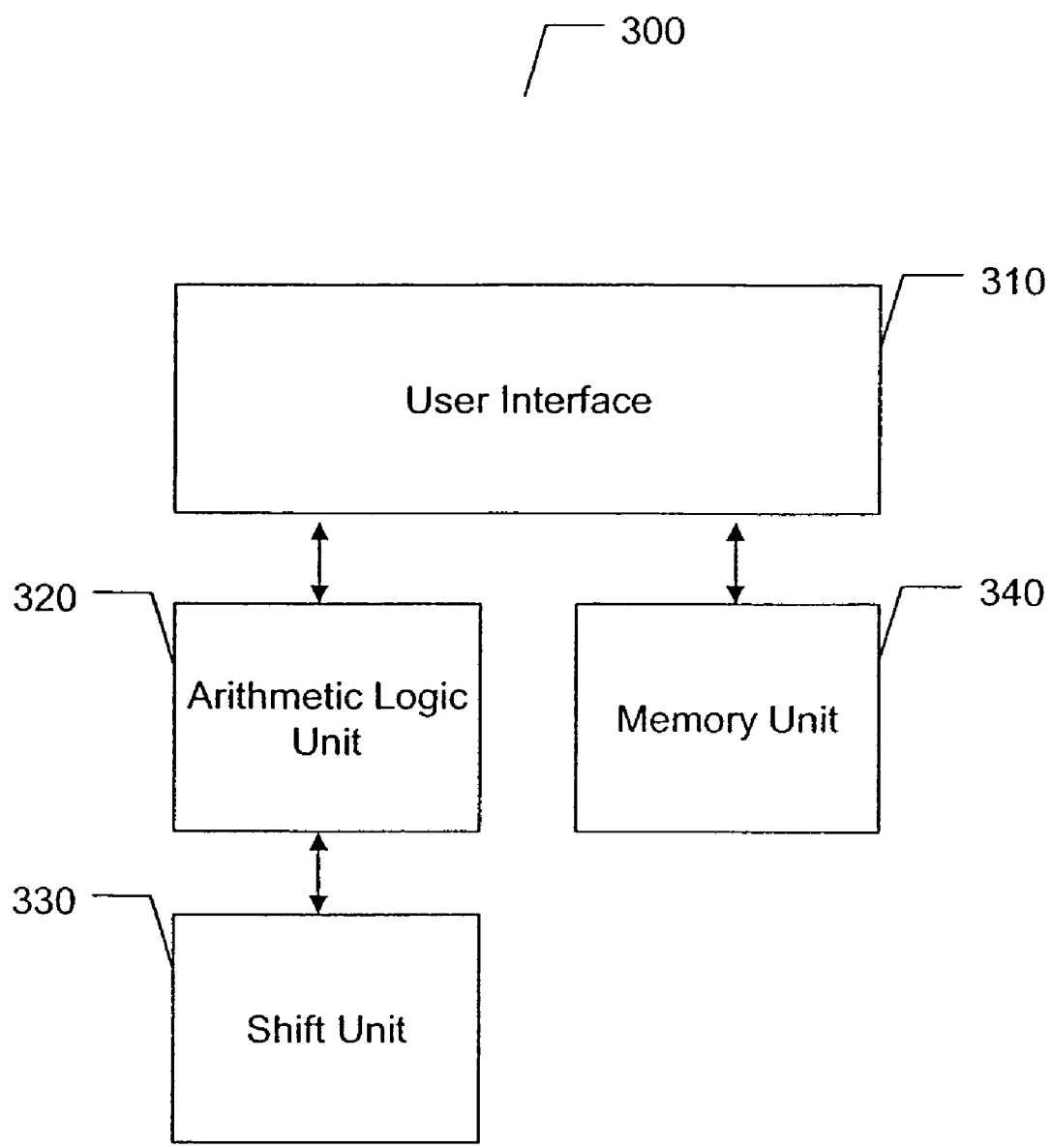
FIG. 3 is a block diagram illustrating the modules which make up the example system referenced in the detailed description of the invention.

FIG. 3 is a block diagram depicting the implementation architecture of the example calculator. Calculator 300 includes a User Interface (UI) 310, which accepts input from the user. An Arithmetic Logic Unit (ALU) 320 is provided that computes the results of mathematical operations on pairs of numbers. A shift unit (SHFT) 330 is also provided, and is used by ALU 320 when computing multiplication results. A memory unit (MEM) 340 is provided to implement the six memory registers defined in the functional specification, along with an additional register "0" which is used to store the last result computed by the calculator.

Scenario Algebra

When considering sets of tests that can be run on a system, it is useful to have a set based notation to provide a short hand representation of the tests being described. This notation is referred to herein as scenario algebra. Braces ("{ }") are used to denote an literal set (e.g., "{1 , 2, 3} " denotes the set that includes the numbers 1, 2 and 3). Ellipses (" . . . ") are used to denote a range (e.g., "{1 . . . 99}" represents the set including the numbers 1 through 99, inclusive). The "C{SetName} " notation is used to refer to a named set of values (e.g., "C{MathNum}={1 . . . 99} " defined a set called "MathNum" that includes the numbers 1 to 99 inclusive. The "+" or conjunction operator is used to identify a set of sets (e.g., "{A, B, C}+{1, 2, 3}" identifies a set that includes two other sets, namely "{A, B, C}" and "{1, 2, 3}". The "*" or product operator is used to identify a set that includes all possible combinations of elements from a first set paired with elements from a second set (e.g., "{A, B, C}* {2, 3}" would expand to the set of combinations "{A2, A3, B2, B3, C2, C3}").

Identify Scenario Spaces (Step 200)

The objective of this operation is to identify a set of tests (e.g., the set of all possible tests) that could be run on the system to be verified, otherwise known as the Device Under Test (DUT). This set of all possible tests is called the scenario space for the DUT. The DUT may be too complex to make it feasible to analyze the whole system in one step in order to identify its complete scenario space, and a method is required to analyze the DUT in portions under such conditions.

As described above, the central problem in functional verification is to test a sufficient number of (e.g., all) possible conditions that DUT could encounter during operation. To achieve this goal, it is necessary that the scenario space identified for the DUT at this step covers all these possible conditions. First, the functional requirements, or functional specifications for the DUT are analyzed to ensure that the scenario space includes tests for all the functions that the DUT is required to support, along with the possible interactions between those functions. Second, the implementation architecture for the DUT—which specifies the hardware and software blocks that make up the DUT, as well as their interaction—also needs to be considered. This ensures that the scenario space includes tests for each block, and the possible interactions between those blocks. Approaching construction of the scenario space from these two angles ensures that no possible tests have been forgotten.

Figure 4:
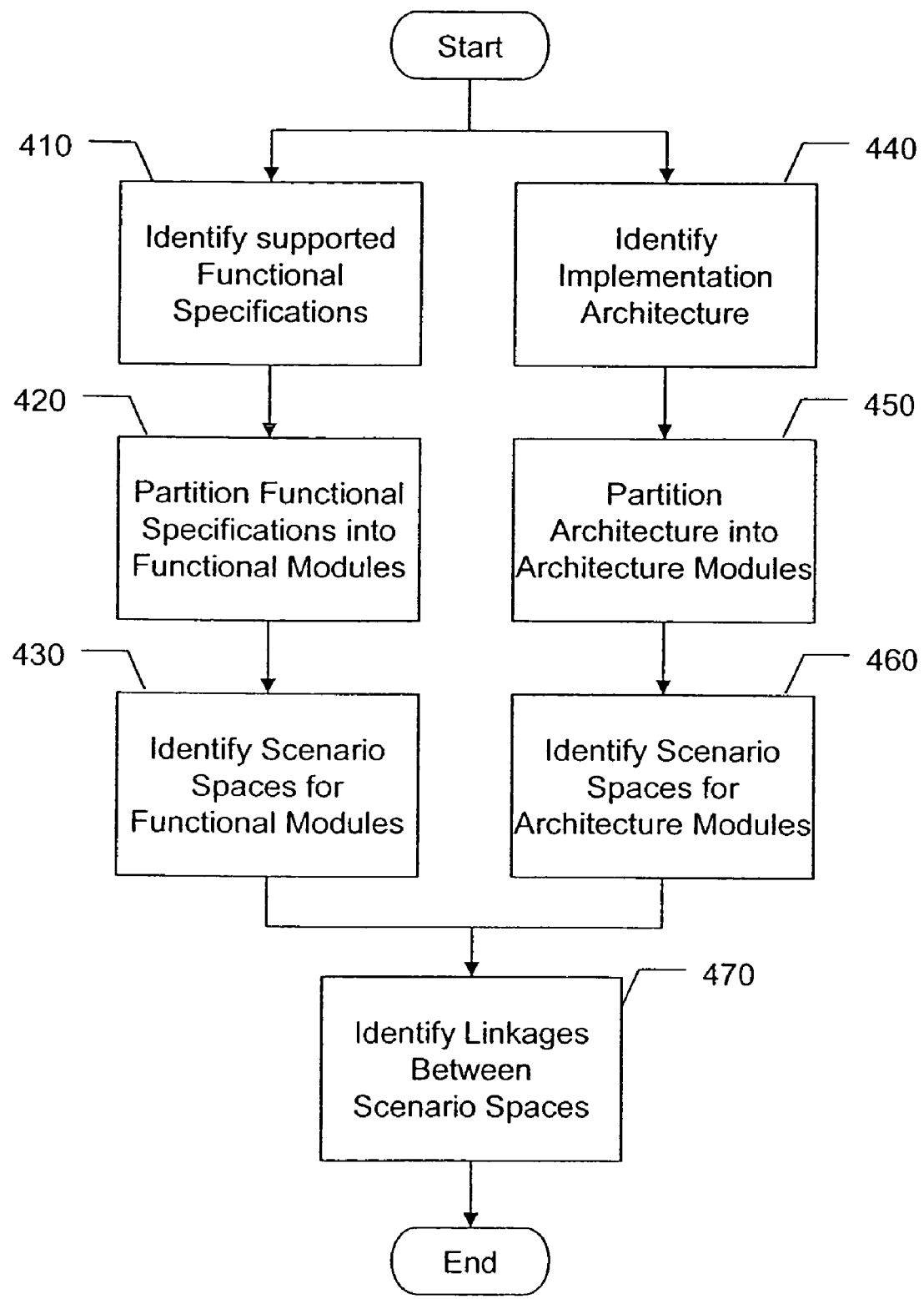
FIG. 4 is a flow diagram depicting the detailed step involved in identifying scenario spaces according to an embodiment of the present invention.

FIG. 4 is a flow diagram depicting the stages involved in identifying the complete scenario space for the DUT. This process includes a functional analysis, which includes identifying the supported functional specifications (step 410), partitioning functional specifications into functional modules (step 420) and identifying scenario spaces for each functional module (step 430), among other such possible actions. Concurrently, an architectural analysis is performed, in which the implementation architecture is identified (step 440), the architecture is partitioned into architecture modules (step 450) and scenario spaces identified for each architectural module (step 460), among other such possible actions. Finally, linkages between scenario spaces are identified (step 470). Each operation within the flow diagram of FIG. 4 is discussed in greater detail below.

Identify Supported Functional Specification (Step 410)

Functional specifications define the required operations that the systems being designed need to support. The scenario space for the DUT should test an acceptably large portion (or all portions) of the functional specifications that the DUT supports. A particular DUT might support several specifications (e.g., a computer sound chip may support the PCI specification as well as one or more audio specifications). The identification of supported functional specifications (step 410), involves identifying the list of specifications that need to be supported by the DUT. In the case of the present example, the specifications for the calculator are provided above.

Partition Functional Specifications into Functional Modules (Step 420)

Functional specifications can typically be analyzed and broken into functional modules that describe specific portions of required behavior. At step 420, the functional specifications are partitioned into functional modules. This is the process of decomposing the supported functional specifications (from step 410) into smaller modules that can more readily be analyzed. In the case of our example, the specification may be divided into two functional modules: the first relates to arithmetic operations, the second related to memory operations. Interactions between these two modules should also be considered when considering the handling of sequenced and nested operations.

Identify Scenario Spaces for each Functional Module (Step 430)

Scenario spaces are then identified for each functional module (step 430). This involves analyzing each functional module identified in step 420 to define the set of tests (e.g., all tests) that could be run to test that functionality. When considering possible tests for a functional module, it is helpful to keep in mind the principle that a function defining S possible states, I possible input combinations and O possible output combinations has a total of SI possible tests, including tests that can transition from every possible state $N_1$ to every possible state $N_2$, and tests that can generate all possible output combinations. There are also S possible initial states that the module could start at. The inventor determined that it is often efficient to consider the scenario space for a module in terms of the product of multiple orthogonal sets.

In terms of our example calculator, the scenario space for the functional module related to arithmetic operations may be captured as:

C{Number}={0 . . . 999};

C{MathOp}={"+", "−", "*"};

C{Arg}=C{Number};

C{MathExpr}=C{Arg}*C{MathOp}*C{Arg};

C{MathExpr} compactly describes the set of all possible combinations of (a) a number from 0 to 999 inclusive, (b) one of the three operations for addition, subtraction and multiplication, and (c) another number from 0 to 999 inclusive. In other words, C{MathExpr} captures the scenario space for the functional module related to arithmetic operations.

To understand this, a method to expand a scenario space description into a specific test that lies within that scenario space is needed. The following steps outline such a method:

(a) Find the first reference to a set in the scenario space description.

(b) If the set in (a) is a reference to a named set (e.g., C{MathExpr}), replace it with the definition of the named set.

(c) If the set in (a) is a literal set (e.g., {1, 2, 3}), replace it with a selection from within the set.

(d) Repeat from step (a) till no more references to sets remain within the expression.

Applying this method to C{MathExpr}, the following is an example of the sequence of results that could be obtained:

1: C{MathExpr}=C{Arg}*C{MathOp}*C{Arg};

2: C{MathExpr}={0 . . . 999}*C{MathOp}*C{Arg};//Expand C{Arg}

3: C{MathExpr}=123*C{MathOp}*C{Arg}; //select 123 from {0 . . . 999}

4: C{MathExpr}=123*{"+", "−", "*"}*C{Arg}; //Expand C{MathOp}

5: C{MathExpr}=123*"−"*C{Arg};//select "−" from {"+", "−", "*"}

6: C{MathExpr}=123*"−"*{0 . . . 999}; //Expand C{Arg}

6: C{MathExpr}=123*"−"*87; //select 87 from {0 . . . 999}

Thus, C{MathExpr} was expanded to the test "123−87". Other expansion of this scenario space may generate other tests (e.g., "832+12" and "5*142").

Similarly, the scenario space for the functional module related to memory operations may be described by C{MemExpr}:

C{Register}={1 . . . 6};

C{STOExpr}=C{Arg}*STO*C{Register};

C{RCLExpr}=RCL*C{Register};

C{MemExpr}=C{STOExpr}+C{RCLExpr};

C{MemExpr} expands to tests such as "234 STO 2" and "RCL 3". Since the memory function involves state, it is possible to define an initial state for this memory in terms of scenario spaces as well. The following pseudo-code will fill each register with a random number selected from C{Number}:

foreach reg C{Register} do
  C{Number}*STO*reg;

Identify Implementation Architecture (Step 440)

The implementation architecture of the DUT specifies the hardware and software blocks of which the DUT is constructed. The scenario space should cover tests for (preferably all) blocks within the DUT. Tests for (again, preferably all) possible interactions between those blocks should also be considered. In identifying the implementation architecture, the hardware and software components that are required to make the DUT function as required are identified (step 440). The implementation architecture for the example calculator is described above.

Partition Architecture into Architecture Modules (Step 450)

The architecture is then partitioned into architecture modules (step 450), which is the process of decomposing the implementation architecture into its component blocks so that those blocks can be analyzed individually. In the case of our example, the implementation architecture can be broken into the four blocks identified in the architectural description: shift unit (SHFT) 330, the arithmetic logic unit (ALU) 320, the memory unit (MEM) 340 and the user interface (UI) 310. The interactions between these block also needs to be considered.

Identify Scenario Spaces for each Architectural Module (Step 460)

Scenario spaces are then identified for each architectural module (step 460), which involves analyzing each functional module identified in step 420 to define the set of (preferably all) tests that could be run to test that functionality. Parallel to functional modules, when considering possible tests for a architectural module, it is helpful to keep in mind the principle that a block implementing S possible states, I possible input combinations and O possible output combinations has a total of SI possible tests, including tests that can transition from every possible state $N_1$ to every possible state $N_2$, and tests that can generate all O possible output combinations. There are also S possible initial states at which the module could start. The inventor determined that it is often efficient to consider the scenario space for a module in terms of the product of multiple orthogonal sets. For example, the scenario space definition for each architectural module of the example calculator can be considered.

Analysis is performed by beginning with shift unit 330, which is used to perform shift operations on a number to aid in computing the result of multiplication operations. Analysis of this block shows that it accepts an input A which can be a number from −999 to +999, and an input B, which is a number between 0 and 12, indicating the number of bits by which input A is to be shifted. In the present example, it is determined that the implementation of the SHFT block is such that values for input A that lie within the set {−999, −998, +998, +999} are of particular concern when testing. C{ShftTest} defines the scenario space for this block, and includes special consideration for the input A values that are of concern (scenario space defined above are reused without being repeated):

C{Sign}={"*", "−"};

C{SignedNum}=C{Sign}*C{Number}

C{ShftCount}={0 . . . 12};

C{ShftCases}={998, 999};

C{SignedShftCases}=c{Sign}*C{ShftCases};

C{ShftArg}=C{SignedNum}+C{SignedShiftCases};

C{ShftTest}=C{ShftArg}*C{ShftCnt};

The ALU unit accepts two inputs, A and B, both in the range −999 to +999, along with a definition of which arithmetic operation to compute. C{AluTest} define the scenario space for this block:

C{AluTest}=C{SignedNum}*c{MathOp}*C{SignedNum};

Memory unit 340 is provided with a register number, and information on whether to recall a number from that register, or store a number to it. In the latter case, the number to be stored is also provided. It will be noted that although our functional specification identified only six register, the MEM block implements seven. C{MemTests} defines the scenario space for this block:

C{MemReg}={0 . . . 6};

C{MemArg}=C{SignedNum};

C{STOTest}=C{MemArg}*STO*C{MemReg};

C{RCLTest}=RCL*C{MemReg};

C{MemTest}=C{STOTest}+C{RCLTest};

Tests for user interface 310 involve interactions with ALU 320, shift unit 330 and memory unit 340. Discussion of tests for user interface 310 are described subsequently.

Identify Linkages between Scenario Spaces (Step 470)

To this point, scenario spaces have been defined for each functional module and each architectural module, and provide sufficient information to create tests for each of those modules separately. However, in order to create tests that exercise the interactions between modules, the linkages between modules need to be identified. The following examples give consideration to linkages between (a) two functional modules, (b) two architectural modules, and (c) between a functional module and an architectural module.

(a) Interaction between functional modules: Interactions between the arithmetic operation functional module and the memory operation functional module can be captured by the set "CalcExpr", combined with a recursive redefinition of the set "Arg":

C{CalcExpr}=C{MathExpr}+C{MemExpr};

C{Arg}=C{Number}+C{CalcExpr};

C{CalcExpr} now describes a fairly sophisticated scenario space. To illustrate this point, C{CalcExpr} is expanded to yield the following sequence of results:

1: C{CalcExpr}={C{MathExpr}+C{MemExpr}};

2: C{CalcExpr}=c{MathExpr};

3: C{CalcExpr}=C{Arg}*C{MathOp}*C{Arg};

4: C{CalcExpr}={C{Number}+C{CalcExpr}}*C{MathOp}*C{Arg};

5: C{CalcExpr}=C{Number}*C{MathOp}*C{Arg};

6: C{CalcExpr}={0 . . . 999}*C{MathOp}*C{Arg};

7: C{CalcExpr}=32*C{MathOp}*C{Arg};

8: C{CalcExpr}=32*{"+", "−", "*"}*C{Arg};

9: C{CalcExpr}=32*"−"*C{Arg};

10: C{CalcExpr}=32*"−"*{C{Number}+C{CalcExpr}};

11: C{CalcExpr}=32*"−"*C{CalcExpr};

12: C{CalcExpr}=32*"−"*{C{MathExpr}+c{MemExpr}};

13: C{CalcExpr}=32*"−"*C{MemExpr};

14: C{CalcExpr}=32*"−"*{C{STOExpr}+C{RCLExpr}}

15: C{CalcExpr}=32*"−"*C{RCLExpr};

16: C{CalcExpr}=32*"−"*RCL*C{Register}

17: C{CalcExpr}=32*"−"*RCL*{1 . . . 6}

18: C{CalcExpr}=32*"−"*RCL*4;

Thus, this expansion of C{CalcExpr} yielded a test of the form "32−RCL 4", which would compute the results of subtracting the current value of memory register 4 from the number 32. Other expansions of C{CalcExpr} would yield tests such as "(321−654)*((RCL 3+27)STO 3)". This illustrates the combining of scenario space definitions for the arithmetic functional module and the memory functional module to create tests that verify the correct interaction between these modules.

(b) Interaction between architectural modules: Any multiplication operation will exercise interactions between the ALU and SHFT blocks. However, it is desirable to ensure that particular cases of concern for the SHFT block are given proper consideration. C{AluTest} below handles multiplication tests specially in order to create interactions with the SHFT block that exercise the cases of concern.

C{MulTest}=C{ShftArg}*"*"*C{SignedNum};

C{AddSub}={"+", "−"};

C{AddSubTest}=C{SignedNum}*C{AddSub}*C{SignedNum};

C{AluTest}=C{AddSubTest}+C{MulTest};

Tests from C{AluTest} could include, for example, "(−323)−(+235)", and "(+998)*(−47)", the latter test being design to stress the SFHT unit.

(c) Interaction between functional module and architectural module: to construct the complete scenario space for our example calculator, the linkages between the functional modules and architectural modules need to be considered. To cover user interface 310, tests similar to the those covered by C{CalcExpr} are needed to exercise sequenced and nested operations, but these tests also need to consider interactions between architectural modules. Also, negative numbers cannot be provided to the ALU and MEM units directly, but are constructed by subtracting positive numbers from zero. The complete scenario space for the example is provided below in its entirety:

```
// positive and negative numbers
C{PosNum} = { 0 . . . 999 };
C{NegNum} = 0 * "−" * C{PosNum};
C{Number} = C{PosNum} + C{NegNum};
// special numbers for SHFT unit
C{PosShftNum} = { 999, 998 };
C{NegShftNum} = 0 * "−" * C{PosShftNum};
C{ShftNum} = C{PosShftNum} + C{NegShftNum};
// Multiplication Operations
C{Arg} = C{Number} + C{CalcExpr}; // C{CalcExpr} defined below
C{MulArg} = C{Arg} + C{ShftNum};
C{MulExpr} = C{MulArg} * "*" * C{Arg}; // mult ops target SHFT unit
// Addition / Subtraction operations
C{AddSub} = {"+", "−"};
C{AddSubExpr} = C{Arg} * C{AddSub} * C{Arg};
C{MathExpr} = C{AddSubExpr} + C{MulExpr};
// Memory operations
C{MemReg} = {0 . . . 6}; // from architectural module
C{STOExpr} = C{Arg} * STO * C{MemReg};
C{RCLExpr} = RCL * C{MemReg};
C{MemExpr} = C{STOExpr} + C{RCLExpr};
// Sequenced and nested operations
C{CalcExpr} = C{MathExpr} + C{MemExpr};
```

C{CalcExpr} now defines the entire scenario space for the example calculator, and comprehends both the functional requirements of handling nested and sequenced operations, as well as architectural concerns such as the special cases for shift unit 330. Interactions between the modules will also be tested. An example test might be "(−998*RCL 0)+((342 STO 3)−RCL 3)".

C{MathExpr} can still be used to create tests that target the ALU and SHFT units, with the following redefinitions to prevent nested operations:

```
C{NegNum} "−" * C{PosNum};        // create −543, not (0-543)
C{NegShftNum} = "−" * C{PosShftNum};  // create −543, not (0-543)
C{Arg} = C{Number};               // No nested operations.
```

Encode Scenario Spaces (Step 210)

From the foregoing, it can be seen that scenario algebra can be used to compactly capture complex scenario spaces. The DUT was broken down by functional specification and by implementation architecture and each module considered independently to define its scenario space. Module scenario spaces were then combined to create the scenario space for the whole DUT. The resulting scenario spaces can describe very large numbers of possible tests. This is of limited use unless scenario space descriptions can be conveniently captured in a computer readable for so that it may be processed by software.

Encoding scenario spaces (step 210) is the process of encoding the scenario space defined in step 200 into a computer readable form. In one embodiment of the scenario search algorithm, scenario rules are used to capture scenario space descriptions.

Scenario rules are software objects that have associated with them slots and methods. A slot is a unit of data storage associated with a specific rule. A method is a sequence of operations associated with a specific rule. Rules should have at least one default method (called the run method) that is executed when the rule is evaluated. A slot values for a given rule can only be read and written by methods associated with that rule. Methods of a given rule may call other methods of the same rule, or evaluate different rules. Evaluating a rule returns a value. It is possible to redefine a rule or a method, or assign a new value to a slot.

Scenario rules are organized in an inheritance hierarchy. Every rule has a parent rule associated with that rule, and is a specialization of that parent rule. When an attempt is made to access a slot or method associated with a rule, and no matching slot of method exists, the parent is searched for that slot or method. This search is continued recursively until the root of the inheritance hierarchy is reached before reporting that the slot or method does not exist. Inheritance allows multiple similar rules to be encoded using scenario rules that share common methods.

Every rule has a weight associated with that rule. If a parent rule (having one or more child rules) is evaluated, the parent rule randomly selects one of its children, weighting this selection based on the weights of the child rules. The selected child is then evaluated. This repeats until a leaf rule (with no further children) is reached. The default weight of all rules is set to one. This mechanism allows encoding of complex sets. Weights can be manipulated to determine the range and frequency of selections that will be made.

Providing each rule with its own pseudo-random number seed allows for random stability, where addition of an extra rule evaluation does not change the sequence of child selection made by all other rules. This feature can be useful when trying to debug and fix a specific problem with a scenario space encoding.

Often it is necessary for a scenario rule to change its behavior based on prior decisions made while constructing a test. In our example, instead of initializing all memory registers at the beginning of a test, one may choose to only initialize registers as those registers are used. In this case, it would be necessary to store information about what registers have been initialized so far.

Scenario rules may also be reactive, where behavior of rules and/or their weights are changed based on the current state of the DUT. This allows the scope and distribution of tests to be changed based on activity within the DUT, allowing better focus on difficult to reach conditions.

It has been found beneficial to use a working-memory to store information about the current state of test generation. This information can be accessed by any scenario rule. Further, the inventor has determined that it is beneficial to divide working-memory into three sections: (a) data this is persistent for the current step of the test being generated, (b) data that is persistent for the current sequence of steps being generated, and (c) data that is persistent for an entire session during which multiple sequences of steps may be generated. The inventor has also found it beneficial to allow for storage of numbers, string, lists and associative arrays in the working memory. For the present example, it would be appropriate to use sequence working-memory to store information about the current state of the memory registers at any given point in the test sequence.

Rule specialization and inheritance properties make scenario rules a very efficient method for encoding scenario spaces. The following pseudo-code encodes the scenario space defined by C{Arg}. This demonstrates how scenario algebra can be encoded using scenario rules to represent each defined scenario algebra set. It will also be noted the manner in which inheritance can make this representation even more compact, and minimized duplicated code for similar operations. For example, note that the steps to create a negative number are identical for C{NegNum} and C{NegShftNum}, although different sets of numbers are being negated. Both C{NegNum} and C{NegShftNum} inherit these steps from their common parent C{Arg}.

```
// Top level C{Arg} rule
DefineRule "Arg" : parent "UserRules" {
    DefineMethod "negNumber" {
        Return ("0-" + call-method "posNumber"); // Code to nagate #
    }
}
// C{Number} rule
DefineRule "Number" : parent "Arg" {
    DefineMethod "posNumber" {
        Return ( random(1000) ); // Code for random value between
            0 & 999
    }
}
DefineRule "PosNum" : parent "Number" {
    DefineMethod "run" {      // default method
        Return (call-method "posNumber"); //inherit from "Number"
    }
}
DefineRule "NegNum" : parent "Number" {
    DefineMethod "run" {
        Return (call-method "negNumber"); // inherit from "Arg"
    }
// Numbers for C{PosShftNum} rule
DefineRule "ShftNumSet" : parent "UserRules"{
    DefineMethod "run" {
        Return (slot-value "shftnum");
    }
}
DefineRule "ShftNum999" : parent "ShftNumSet" {
    DefineSlot "shftnum" = "999";
}
DefineRule "ShftNum998" : parent "ShftNumSet" {
    DefineSlot "shftnum" = "998";
}
// C{ShftNum} rule
DefineRule "ShftNum" : parent "Arg" {
    DefineMethod "posNumber" {
```

```
-continued

Return (evaluate-rule "ShftNumSet");
    }
}
DefineRule "PosShftNum" : parent "ShftNum" {
    DefineMethod "run" {
        Return (call-method "posNumber"); //inherit from "ShftNum"
    }
}
DefineRule "NegShftNum" : parent "ShftNum" {
    DefineMethod "run" {
        Return (call-method "negNumber"); // inherit for "Arg"
    }
}
```

The product of two scenario spaces may be encoded simply by evaluating multiple scenario rules from within a method. For example, to encode C{AddSubExpr}:

```
// C{Addsub} operators
DefineRule "AddSub" : parent "UserRules" {
    DefineMethod "run" {
        Return (slot-value "op");
    }
}
DefineRule "AddSub+" : parent "AddSub" {
    DefineSlot "op" = "+";
}
DefineRule "AddSub-" : parent "AddSub" {
    DefineSlot "op" = "-";
}
DefineRule "AddSubExpr" : parent "UserRules" {
    DefineMethod "run" { // C{Arg} * C{AddSub} * C{Arg}
        Return (associative-array ("arg1" = evaluate-rule "Arg",
                "op" = evaluate-rule "AddSub",
                "arg2" = evaluate-rule "Arg");
    }
}
```

Rules such as "AddSub" and "ShftNumSet" are implemented with a separate rule for each member only in order to allow the selection weights of each member to be manipulated separately. For example, by setting the weight of rule "AddSub-" to five, it would be possible to generate tests with five time as may subtractions as additions. This construct is used frequently when encoding scenario spaces, and it is beneficial to provide a short-hand macro to define literal sets.

Generate Random Tests (Step 220)

Once scenario spaces for the system have been identified (step 200), and encoded using scenario rules (step 210), the actual generation of random tests is then effected. The user defines the number of steps to include in each sequence. To generate tests, the top level scenario rule (for our example, the rule describing C{CalcExpr}) is evaluation repeatedly, once for each of the required steps. Each call to the top level rule returns an associative array describing the test to be done at that step. A list of associative arrays is constructed to represent the generated test in an internal format.

It will be noted that scenario rules can encode very large and complex scenario spaces in a compact form. Each evaluation of the top level scenario rule results in generating a test which represent a specific, randomly selected point within that space. The scope and distribution of generated tests can be controlled by modifying the weights on individual scenario rules. Setting a weight to zero will ensure that the rule will never be selected. Setting a weights to a high number will cause that rule to be evaluated more frequently than its siblings.

Format Test Output (Step 230)

The result of generating random tests (step 220) is an internal representation of the test to be generated. The next operation is to format each step of the test into an output form suitable for use in the target verification environment. Each step is represented as an associative array, with fields defining properties of the test to be executed. It has been found beneficial to define an additional field in the associative array defining the step-type for each step. Format rules can then be defined to output each step-type to the required format. The inventor has determined that the use of scenario rules to encode format rules is advantageous, removing the need for a separate implementation of format rules. The names of format rules can be built based on the step type. For example, the name of the format rule to output a step of type "MathExpr" may be called "Fmt-MathExpr", Tests can be output to an intermediate file that can then be read into a verification environment. Tests can also be directly applied to the DUT through simulator PLI calls or through software function calls. Reactive testing may be accomplished by applying the test for each step as it is constructed directly to the DUT.

In addition to applying the test to the DUT, information from the internal representation of the test can also be used to interact with the result checking mechanism (for example, the tests may be provided in a different format to a reference model which returns an expected result that can be checked for in the DUT), or with a coverage analysis mechanism (for example, by counting the number of times a particular rule, or combination of rules have been exercised to provide a measure of how complete testing has been to date). The disclosure of Appendix A, a description of an example commercial implementation, is included by reference herein, in its entirety and for all purposes.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A method comprising:
   generating an encoded scenario space by encoding a scenario space using one or more scenario rules, wherein
   a scenario rule is defined by a scenario algebra, and
   the encoded scenario space is encoded using an architectural scenario space and a functional scenario space;
   forming a first scenario rule of the plurality of scenario rules comprising one or more of a first sequence of operations, a first unit of data storage, and a link to a second scenario rule;
   forming the second scenario rule of the plurality of scenario rules comprising one or more of a second sequence of operations and a second unit of data storage, wherein
   the second sequence of operations comprises the first sequence of operations, if any, and
   the second unit of data storage comprises the first unit of data storage, if any;
   receiving an encoded scenario space; and
   generating a test for a device under test (DUT) using the encoded scenario space.

2. The method of claim 1 further comprising:
   performing said generating the test for the DUT for a number of iterations,
   wherein
   each of the number of iterations provides a point in a scenario space.

3. The method of claim 1 wherein a scenario rule comprises one or more of:
   a sequence of operations;
   a unit of data storage accessible to the sequence of operations; and
   a link to another scenario rule.

4. The method of claim 1 further comprising:
   weighting a one of the scenario rules with a weighting factor.

5. The method of claim 1 further comprising:
   forming a third scenario rule of the plurality of scenario rules comprising one or more of a third sequence of operations and a third unit of data storage, wherein
   the third sequence of operations comprises the first sequence of operations, if any,
   the third unit of data storage comprises the first unit of data storage, if any, and
   the first scenario rule further comprises a link to the third scenario rule;
   weighting the second scenario rule with a first weighting factor; and
   weighting the third scenario rule with a second weighting factor.

6. The method of claim 5 further comprising:
   determining the first and second weighting factors based on a current state of a device under test ("DUT").

7. The method of claim 5 wherein generating a test for the device under test comprises:
   evaluating the first scenario rule;
   selecting one of the second and third scenario rules, wherein
   said selecting is random, and
   said selecting is adjusted by the first and second weighting factors; and
   evaluating the selected one of the second and third scenario rules.

8. The method of claim 7 wherein evaluating the first scenario rule comprises:
   executing the first sequence of operations.

9. The method of claim 1 wherein said encoding the scenario space comprises:
   placing the scenario space into computer readable form.

10. The method of claim 9 further comprising:
    forming an inheritance hierarchy of scenario rules comprising
    a parent scenario rule comprising one or more of a parent sequence of operations and a parent unit of data storage, and
    a first child scenario rule that accesses the parent sequence of operations and the parent unit of data storage, if any.

11. The method of claim 10 further comprising:
    weighting the first child scenario rule by a first weighting factor; and
    weighting a second child scenario rule by a second weighting factor, wherein the second child scenario rule accesses the parent sequence of operations and the parent unit of data storage.

12. The method of claim 11 wherein said generating a test for the DUT further comprises:
    evaluating the parent scenario rule;
    selecting one of the first and second child scenario rules, wherein
        said selecting is random, and
        said selecting is adjusted by the first and second weighting factors; and
    evaluating the selected child scenario rule.

13. A computer-readable storage medium comprising:
    a first set of instructions, executable on a processor, configured to generate an encoded scenario space by encoding a scenario space using one or more scenario rules, wherein
        a scenario rule is defined by a scenario algebra, and
        the encoded scenario space is encoded using an architectural scenario space and a functional scenario space;
    a second set of instructions, executable on the processor, configured to form a first scenario rule of the plurality of scenario rules comprising one or more of a first sequence of operations, a first unit of data storage, and a link to a second scenario rule;
    a third set of instructions, executable on the processor, configured to form the second scenario rule of the plurality of scenario rules comprising one or more of a second sequence of operations and a second unit of data storage, wherein
        the second sequence of operations comprises the first sequence of operations, if any, and
        the second unit of data storage comprises the first unit of data storage, if any;
    a fourth set of instructions, executable on the processor, configured to receive the encoded scenario space; and
    a fifth set of instructions, executable on the processor, configured to generate a test for a device under test (DUT) using the encoded scenario space.

14. A system comprising:
    a first processor configured to generate an encoded scenario space by encoding a scenario space using one or more scenario rules, wherein
        a scenario rule is defined by a scenario algebra, and
        the encoded scenario space is encoded using an architectural scenario space and a functional scenario space;
    form a first scenario rule of the plurality of scenario rules comprising one or more of a first sequence of operations, a first unit of data storage, and a link to a second scenario rule;
    form the second scenario rule of the plurality of scenario rules comprising one or more of a second sequence of operations and a second unit of data storage, wherein
        the second sequence of operations comprises the first sequence of operations, if any, and
        the second unit of data storage comprises the first unit of data storage, if any;
    a memory, couple to the first processor, and configured to store the encoded scenario space; and
    a second processor, coupled to the memory, and configured to generate a test for a device under test (DUT) using the encoded scenario space.

15. An apparatus comprising:
    means for generating an encoded scenario space by encoding a scenario space using one or more scenario rules, wherein
        a scenario rule is defined by a scenario algebra, and
        the encoded scenario space is encoded using an architectural scenario space and a functional scenario space;
    means for forming a first scenario rule of the plurality of scenario rules comprising one or more of a first sequence of operations, a first unit of data storage, and a link to a second scenario rule;
    means for forming the second scenario rule of the plurality of scenario rules comprising one or more of a second sequence of operations and a second unit of data storage, wherein
        the second sequence of operations comprises the first sequence of operations, if any, and
        the second unit of data storage comprises the first unit of data storage, if any;
    means for receiving an encoded scenario space; and
    means for generating a test for a device under test (DUT) using the encoded scenario space.

16. The apparatus of claim 15 further comprising:
    means for forming a inheritance hierarchy from the plurality of scenario rules, wherein
        the inheritance hierarchy comprises
            a parent scenario rule including one or more of a parent sequence of operations, a parent unit of data storage, and a link to a first child scenario rule, and
            first and second children scenario rules that access the parent sequence of operations and the parent unit of data storage, if any;
    means for weighting the first child scenario rule by a first weighting factor; and
    means for weighting the second child scenario rule by a second weighting factor.

* * * * *